United States Patent
Rylov (10) Patent No.: US 11,115,027 B2
(45) Date of Patent: Sep. 7, 2021

(54) DIRECT CURRENT POWERED CLOCKLESS SUPERCONDUCTING LOGIC FAMILY USING DYNAMIC INTERNAL STATES

(71) Applicant: International Business Machines Corporation, Armonk, NY (US)

(72) Inventor: Sergey Rylov, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/850,203

(22) Filed: Apr. 16, 2020

(65) Prior Publication Data

US 2020/0287550 A1    Sep. 10, 2020

Related U.S. Application Data (62) Division of application No. 16/174,982, filed on Oct. 30, 2018, now Pat. No. 10,680,617.

(51) Int. Cl.
*H03K 19/195* (2006.01)
*G06F 1/10* (2006.01)
*H03K 3/38* (2006.01)

(52) U.S. Cl.
CPC .......... *H03K 19/1952* (2013.01); *G06F 1/10* (2013.01); *H03K 3/38* (2013.01)

(58) Field of Classification Search
CPC ......... H03K 19/1952; H03K 3/38; G06F 1/10
See application file for complete search history.

(56) References Cited

U.S. PATENT DOCUMENTS

| | | | | |
|---|---|---|---|---|
| 4,274,015 A | * | 6/1981 | Faris | H03K 19/1952 327/306 |
| 4,482,821 A | * | 11/1984 | Houkawa | H03K 17/92 326/4 |
| 4,918,328 A | * | 4/1990 | Kuo | H03K 17/58 327/100 |
| 5,942,997 A | | 8/1999 | Silver et al. | |
| 6,242,939 B1 | * | 6/2001 | Nagasawa | G11C 11/44 326/3 |
| 6,483,339 B1 | * | 11/2002 | Durand | H03K 19/1952 326/5 |
| 6,580,310 B2 | | 6/2003 | Herr | |
| 7,786,786 B2 | | 8/2010 | Kirichenko | |

(Continued)

FOREIGN PATENT DOCUMENTS

EP     1 069 687 A2    1/2001
WO    2008/089067 A1   7/2008

OTHER PUBLICATIONS

Non-Final Office Action received for U.S. Appl. No. 16/174,982 dated Dec. 23, 2019, 23 pages.

(Continued)

*Primary Examiner* — Seokjin Kim
(74) *Attorney, Agent, or Firm* — Amin, Turocy & Watson, LLP (57) ABSTRACT

Techniques regarding a DSFQ logic family are provided. For example, one or more embodiments described herein can comprise a system, which can comprise a dynamic single flux quantum logic circuit that has a self-resetting internal state and can be powered by direct current. Further, the self-resetting internal state can be characterized by two time constants.

19 Claims, 7 Drawing Sheets

(56) References Cited

U.S. PATENT DOCUMENTS

| | | | |
|---|---|---|---|
| 8,571,614 B1* | 10/2013 | Mukhanov | H01L 27/18 |
| | | | 505/170 |
| 9,473,124 B1 | 10/2016 | Mukhanov et al. | |
| 9,543,959 B1 | 1/2017 | Carmean et al. | |
| 9,853,645 B1 | 12/2017 | Mukhanov et al. | |
| 10,615,783 B2* | 4/2020 | Powell, III | H03K 19/195 |
| 2005/0078022 A1* | 4/2005 | Hirano | H03K 3/38 |
| | | | 341/143 |
| 2018/0102166 A1* | 4/2018 | Braiman | H01L 39/223 |

OTHER PUBLICATIONS

Mukhanov, "Energy-Efficient Single Flux Quantum Technology", to appear in IEEE Trans. Appl. Supercond., vol. 21, No. 3, Jun. 2011, 10 pages.

* cited by examiner

DIRECT CURRENT POWERED CLOCKLESS SUPERCONDUCTING LOGIC FAMILY USING DYNAMIC INTERNAL STATES

STATEMENT REGARDING FEDERALLY SPONSORED RESEARCH OR DEVELOPMENT

This invention was made with Government support under W911NF-14-C-0090 awarded by Army Research Office. The Government has certain rights to this invention.

BACKGROUND

The subject disclosure relates to a clockless superconducting logic family, and more specifically, to one or more direct current ("dc") powered dynamic single flux quantum ("DSFQ") logic circuits having one or more dynamic internal states.

Superconducting single flux quantum ("SFQ") logic is considered an attractive alternative to complimentary metal-oxide-semiconductor ("CMOS") technology in high performance computing ("HPC") due to its high speed and a promise to reduce power in practical HPC applications (e.g., by about 2 orders of magnitude as compared to typical CMOS implementations), while using standard thin-film very-large-scale integration ("VLSI") lithographic fabrication process.

However, most logic gates in the existing dc-powered SFQ logic families (e.g., rapid single flux quantum ("RSFQ") and energy-efficient rapid single flux quantum ("ERSFQ")) operate intrinsically as state machines (i.e., having internal logic states and requiring a clock signal to reset to a ground state after each clock cycle). Explicit use of clock signals in logic networks creates significant challenges for VLSI SFQ digital design, particularly concerning application of register transfer level ("RTL") design paradigm, which is a cornerstone of VLSI digital design methodology. RTL paradigm assumes that large digital circuits can be subdivided into clocked registers holding all system states and clock-free, state-free logic networks of significant depth called combinational logic clouds.

Further, achieving dc-powered SFQ logic circuits that do not require a clock signal for operation is a difficult task. Traditionally internal logic states in SFQ superconducting logic gates are stored as currents circulating in superconducting loops that consist of superconducting wires (i.e., linear inductors) and Josephson junctions, the latter behaving as highly nonlinear superconducting inductors. More specifically, when a current through one of Josephson junctions in such storage loop temporary exceeds its critical current, that Josephson junction transitions to a resistive state and allows a discrete amount of magnetic flux (i.e., a single flux quantum, known as a "fluxon") to enter or exit the storage loop, after which that Josephson junction can become superconducting again.

Switching of the Josephson junctions in a storage loop to implement a reset (i.e., a removal of a previously inserted fluxon) can be achieved through the application of one or more external signals (e.g., pulse-like currents originating from Josephson junctions switching events in one or more adjacent circuits). However, traditional SFQ circuitry does not comprise a storage loop that can remove a stored fluxon without the application of external signals; and therefore, cannot self-reset.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, apparatuses, and/or methods regarding clockless, dc-powered DSFQ logic circuits are described.

According to an embodiment, a system is provided. The system can comprise a dynamic single flux quantum logic circuit that has a self-resetting internal state and is powered by direct current, wherein the self-resetting internal state is characterized by two time constants. An advantage of such a system can be compatibility with established VLSI digital design methodology, specifically manifesting in support of RTL paradigm.

In some examples, the two time constants can be dictated by a storage element comprised within the dynamic single flux quantum logic circuit. Also, the storage element can be characterized by nonlinear leakage of magnetic flux. An advantage of such a system can be in supporting asynchronously evaluating combinational logic networks of significant depth.

According to an embodiment, an apparatus is provided. The apparatus can comprise a first circuit branch comprising a first Josephson junction arranged in series with a resistor. The apparatus can also comprise a second circuit branch connected in parallel with the first circuit branch and comprising a second Josephson junction. An advantage of such an apparatus can be that a dynamic single flux quantum logic circuit comprising the apparatus can exhibit a self-resetting internal state that can be characterized by a first time constant intrinsic to Josephson junctions and a second time constant that can be defined by the resistor.

In some examples, the apparatus can also comprise a superconducting inductor connected in series with a parallel connection of the first circuit branch and the second circuit branch. An advantage of such an apparatus can be that a dynamic single flux quantum logic circuit comprising the apparatus can achieve at least one order of magnitude improvement over traditional SFQ circuits in input skew tolerance for a given clock cycle.

According to an embodiment, a method is provided. The method can comprise forming a first circuit branch comprising a first Josephson junction arranged in series with a resistor. The method can also comprise forming a second circuit branch connected in parallel with the first circuit branch and comprising a second Josephson junction. An advantage of such a method can be the formation of a nonlinear magnetic flux element that can enable a dynamic single flux quantum logic circuit to minimize storage loop recovery time (i.e., a time when the dynamic single flux quantum logic circuitry is returning to its ground state for the next clock cycle and therefore is temporarily inoperable).

In some examples, the first circuit branch and the second circuit branch can establish the self-resetting internal state characterized by a first time constant and a second time constant. The first time constant can be an intrinsic time constant to Josephson junctions and the second time constant can be defined by the resistor. An advantage of such a method can be the formation of a nonlinear magnetic flux leakage element that can enable a dynamic single flux quantum logic circuit to keep a circulating current nearly constant for a respective hold time exceeding a basic intrinsic time constant of Josephson junctions by 1 to 2 orders of magnitude.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problems with conventional dc-powered SFQ logic circuits, the present disclosure can be implemented to produce a solution to one or more of these problems in the form of a dc-powered DSFQ logic family comprising one or more logic circuits characterized by internal states that are self-resetting. Advantageously, the DSFQ logic family described herein can include one or more DSFQ logic circuits comprising one or more inductive dynamic storage loops having a well-defined dynamic hold time, while self-resetting in a fraction of the hold time; thereby alleviating the necessity of a clock signal for operation. Also, the one or more embodiments of the DSFQ circuits described herein can advantageously achieve at least one order of magnitude improvement over traditional SFQ circuits with regards to input skew tolerance for a given clock cycle, and thus can enable cascades of DSFQ logic gates (e.g., combinational logic clouds, which can be important for RTL digital design methodology in VLSI) without exceeding the DSFQ logic gates' input skew margins.

Various embodiments of the present invention can be directed to systems, apparatuses, and/or methods regarding dc-powered DSFQ logic circuits that can have a self-resetting internal state. In one or more embodiments, the DSFQ logic circuits described herein can use return-to-zero signaling with SFQ pulses, can be dc-powered, and/or can be implemented either as RSFQ circuits (e.g., powered with one or more resistors off a common voltage bus) or ERSFQ circuits (e.g., powered with a series connection of Josephson junction and a large inductor off a dc voltage bus of a smaller voltage). Further, the self-resetting internal state can be characterized by two time constants dictated by one or more dynamic storage elements further characterized by nonlinear leakage of magnetic flux. Various embodiments of the dynamic storage elements described herein can behave as linear storage inductors with highly nonlinear magnetic flux leakage mechanisms.

For example, the one or more dynamic storage elements can include one or more nonlinear magnetic flux leakage elements comprising two circuit branches. A first circuit branch can comprise a first Josephson junction arranged in series with a resistor, and a second circuit branch can be connected in parallel with the first circuit branch and comprise a second Josephson junction. The first time constant is an intrinsic time constraint of Josephson junctions, and the second time constant is defined by the resistor of the first circuit branch. In one or more embodiments, AND logic gates, OR logic gates, transparent latches, and/or delay buffers can be included in the DSFQ logic family. Thus, one or more embodiments described herein can regard dc-powered DSFQ logic circuits that can be characterized as SFQ logic circuits that can have at least one self-resetting (i.e. dynamic) internal state defined by two time constants.

Figure 1A:
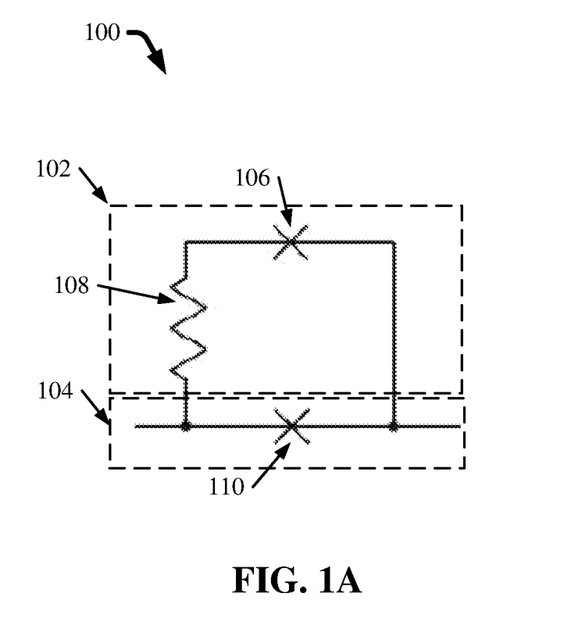
FIG. 1A illustrates a diagram of an example nonlinear magnetic flux leakage element that can be comprised within one or more DSFQ logic circuits of a clockless, dc-powered superconducting logic family in accordance with one or more embodiments described herein.

FIG. 1A illustrates a diagram of an example nonlinear magnetic flux leakage element 100 that can be comprised within one or more DSFQ logic circuits in accordance with one or more embodiments described herein. As shown in FIG. 1, the nonlinear magnetic flux leakage element 100 can comprise a first circuit branch 102 connected in parallel with a second circuit branch 104. The first circuit branch 102 can comprise a first Josephson junction 106 (e.g., depicted by an "X" in FIG. 1A) in series connection with a small resistor 108. Further, the second circuit branch 104 can comprise a second Josephson junction 110 (e.g., depicted by an "X" in FIG. 1A). In various embodiments, the critical currents of the first Josephson junction 106 and/or the second Josephson junction 110 can be equal. In one or more embodiments, the critical current of the first Josephson junction 106 can be slightly less than the critical current of the second Josephson junction 110. Further, first Josephson junction 106 and/or the second Josephson junction 110 can be tightly coupled via the small resistor 108 such that the two Josephson junctions cannot oscillate independently, and therefore a single external shunt resistor (e.g., attached to the second circuit branch 104) can damp the so called "plasma resonance" of Josephson junctions that is formed by their effective inductance and their intrinsic capacitance. That external shunt resistor is in fact setting the first time constant of the nonlinear magnetic flux leakage element 100 and makes it equal to the intrinsic time constant of Josephson junctions, a condition known as critical damping.

In one or more embodiments, the first circuit branch 102 is a dynamic circuit branch, while the second circuit branch is a static circuit branch. For example, on a short time scale the first circuit branch 102 behaves as a Josephson junction, since on a short time scale the small resistor 108 behaves as a superconducting short. On the other hand, on a longer time scale the small resistor 108 behaves as open for superconducting current. In other words, on a short time scale the first circuit branch 102 has a critical current, while on a long time scale the first circuit branch's 102 critical current is zero. As a consequence, a parallel connection of the two branches (e.g., the dynamic first circuit branch 102 and/or static second circuit branch 104), on a short time scale has a critical current equal to a sum of the critical currents of the two Josephson junctions (e.g., the first Josephson junction 106 and/or the second Josephson junction 110), while on a long time scale the two branches has a critical current of only one Josephson junction (e.g., the static, second Josephson junction 110).

Figure 1B:
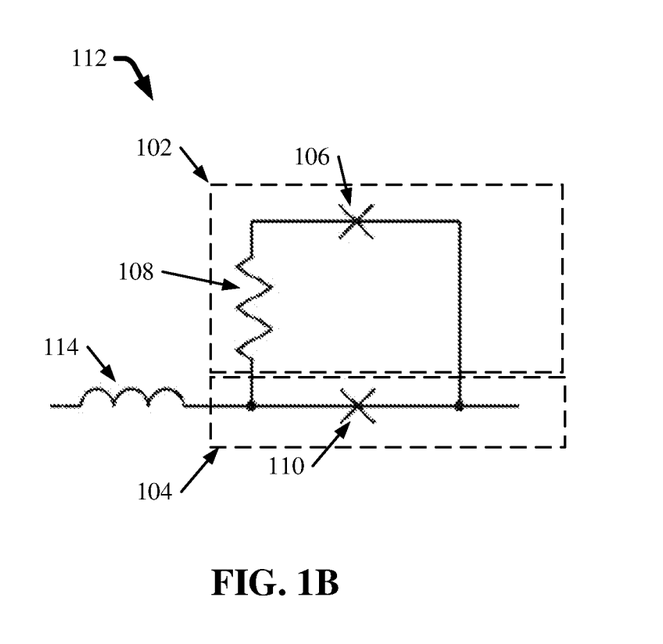
FIG. 1B illustrates a diagram of an example dynamic storage element that can be comprised within one or more DSFQ logic circuits of a clockless, dc-powered superconducting logic family in accordance with one or more embodiments described herein.

FIG. 1B illustrates a diagram of an example dynamic storage loop 112 that can be comprised within one or more DSFQ logic circuits in accordance with one or more embodiments described herein. Repetitive description of like elements employed in other embodiments described herein is omitted for sake of brevity. As shown in FIG. 1B, the dynamic storage loop 112 comprises one or more nonlinear magnetic flux leakage elements 100 in series connection with one or more superconducting inductors 114. Advantageously, the dynamic storage loop 112 enables a DSFQ circuit to keep a circulating current nearly constant (i.e., having a very slow droop caused by a respectively slow leakage of magnetic flux out of the dynamic storage loop 112) for a respective hold time exceeding a basic intrinsic time constant of Josephson junctions by 1 to 2 orders of magnitude. Once the circulating current within the dynamic storage loop 112 droops below a defined threshold, generally corresponding to a reduction of the original current magnitude by 10 to 20 percent, the rate of the magnetic flux leakage and/or a corresponding rate of current droop in the dynamic storage loop 112 accelerates significantly, so that the loop current rapidly approaches zero, and the dynamic storage loop 112 therefore assumes its ground state with no circulating current. As a consequence, the dynamic storage loop 112 can complete the self-resetting faster than the preceding hold time.

The hold time of the dynamic storage loop 112 is a first time constant defined by the first circuit branch 102 of the nonlinear magnetic flux element 100 (particularly by the small resistor 108). A second time constant of the dynamic storage loop 112 is an intrinsic time constant of Josephson junctions (e.g., associated with their plasma resonance and the respective critical damping of that resonance with an external shunt resistor). The first circuit branch 102 enables the dynamic storage loop 112 to have a large hold time (e.g., two orders of magnitude greater than the intrinsic time constant in traditional fabrication nodes) via using particular resistor values for the small resistor 108. For instance, the dynamic storage loop 112 can achieve hold times of greater than or equal to 5 ps and less than or equal to 200 ps (e.g., 50 picoseconds (ps)). The intrinsic time constant associated with the plasma resonance of Josephson junctions is a parameter of a fabrication process that is defined by a thickness of a tunnel barrier of the Josephson junction, which simultaneously controls the capacitance and the critical current density of the Josephson junction.

The product of the inductance value of the superconducting inductor 114 and the sum of the critical currents of the first Josephson junction 106 and the second Josephson junction 110 is kept close to one superconducting magnetic flux quantum. This condition corresponds to dynamic storage loop 112 having a value of close to 6 for its dimensionless inductance parameter ("$\beta_L$") defined by Equation 1 below.

$$\beta_L = 2\pi \times L_{dyn} \times \frac{I_c + I_{cs}}{\Phi_0} \tag{1}$$

Wherein "$L_{dyn}$" represents the inductance value of the superconducting inductor 114, "$I_c$" represents the critical current of the second Josephson junction 110, "$I_{cs}$" represents the critical current of the first Josephson junction 106, and/or "$\Phi_0$" represents one superconducting magnetic flux quantum (i.e., a value of $2.067833831(13) \times 10^{-15}$ Webers (Wb)). The superconducting inductor 114 has a value such that on a short time scale (i.e., a time scale shorter than the dynamic hold time and longer than the intrinsic time constant of the Josephson junctions) the respective $\beta_L$ parameter of the dynamic storage loop 112 is close to a value of 6 (i.e., thereby being a storing loop). This indicates that on a short time scale the nonlinear magnetic flux leakage element 100 behaves as a parallel connection of two Josephson junctions (i.e., as a single Josephson junction with a double critical current and hence half of the inductance of a single Josephson junction).

Further, the superconducting inductor 114 has a value such that on a longer time scale the respective $\beta_L$ parameter of the dynamic storage loop 112 is close to a value of 3 (i.e., indicating a non-storing loop). For example, a longer time scale includes instances where the nonlinear magnetic flux leakage element 100 behaves as just a single Josephson junction, the $\beta_L$ parameter of the dynamic storage loop 112 can drop in half (i.e., drop from a value of 6 to a value of 3). Thus, the nonlinear magnetic flux leakage element 101 quickly switches and releases a stored fluxon from the dynamic storage loop 112. The high speed of the switching process (i.e., as compared to the time it took for the composite Josephson junction to transition from double to single critical current) can be advantageous at least because the fluxon release process can represent a time of inoperability in a typical computing cycle (i.e., a time when the DSFQ circuit comprising the dynamic storage loop 112 is not operable).

Dynamic storage loops 112 having a $\beta_L$ parameter larger than 6 can also be stable but have progressively smaller circulating current. In contrast, dynamic storage loops 112 having a $\beta_L$ parameter of about 3 decays quickly (i.e., can rapidly switch its Josephson junction elements in response to a fluxon insertion), and thereby is non-storing.

In various embodiments, the dynamic storage loop 112 operates as follows. In a ground state all loop currents in the dynamic storage loop 112 (i.e., currents through the superconducting inductor 114, the first Josephson junction 106, and/or the second Josephson junction 110) is at or about a value of zero. Once a magnetic fluxon (i.e., $\Phi_0$) is inserted in the dynamic storage loop 112, a circulating current flows through both the first circuit branch 102 (e.g., first Josephson junction 106) and/or the second circuit branch 104 (e.g., the second Josephson junction 110). Wherein the critical current of the first Josephson junction 106 and/or the second Josephson junction 110 are about equal, the current in the superconducting inductor 114 can initially be split (about 50/50) between the first circuit branch 102 and/or the second circuit branch 104 (i.e., split between the first Josephson junction 106 and/or the second Josephson junction 110), wherein, on a short time scale (e.g., as described herein), the small resistor 108 behaves as a superconducting short. Wherein the $\beta_L$ parameter of the dynamic storage loop 112 is 6, the split currents stay well below the critical current threshold of both Josephson junctions in the nonlinear magnetic flux leakage element 100, thereby enabling stability of the dynamic storage loop 112.

If resistivity of the small resistor 108 were infinitely small (i.e., if the small resistor 108 was superconducting), such 50/50 current split would also stay infinitely long, and all currents in a storage loop would hold constant. However finite resistivity of the small resistor 108 would cause the current in first Josephson junction 106 to decay exponentially with a time constant defined by the small resistor 108 and/or a linearized inductance of the first Josephson junction 106. For example, the time constant is equal to the inductance-to-resistance ratio ("LJ/R") of the first Josephson junction 106 and the small resistor 108 (i.e., wherein "R" represents the electrical resistance of the small resistor 108). Therefore, current in the second Josephson junction 110 starts to exponentially settle higher towards a new value achieved when the current in the first Josephson junction 106 decays to zero. The final settled current through second Josephson junction 110 corresponds to a loop without the first Josephson junction 106 (e.g., since the latter can be effectively disconnected). Thereby, the $\beta_L$ parameter of the dynamic storage loop 112 is reduced to a value of 3 from an original value of 6.

As described herein, a dynamic storage loop 112 with a $\beta_L$ parameter of 3 is non-storing. For example, the current redistribution in the dynamic storage loop 112 causes current though second Josephson junction 110 to exceed the critical current threshold of the second Josephson junction 110 at some point during the current redistribution process, and this redistribution can take a period of time set by a time constant defined by the small resistor 108. For example, the time constant ("$\tau$") is the first time constant described herein, and/or is characterized by Equation 2 below.

$$\tau = \frac{\Phi_0}{\frac{I_{CS} \times R_S}{2\pi}} \quad (2)$$

Wherein "$R_s$" represents the electrical resistance of the small resistor 108 and "$I_{cs}$" represents the critical current of the first Josephson junction 106.

Since the time constant ($\tau$) provided by Equation 2 is inversely proportional to the resistivity of the small resistor 108 (Rs), by making the resistivity of the small resistor 108 (Rs) sufficiently small, the time constant ($\tau$) can be made arbitrarily large (e.g., ~100 ps). For instance, the time constant ($\tau$) can be two orders of magnitude more than a typical Josephson junction intrinsic time (e.g., the second time constant described herein), which can range between 0.5 and 1 ps. Therefore, the switching process (e.g., set by the intrinsic time constant of Josephson junctions), initiated when current through the second Josephson junction 110 finally exceeds the critical current threshold for the second Josephson junction 110, evolves on a sub-picosecond time scale of the Josephson junctions, and therefore is completed in a fraction of the dynamic storage loop's 112 hold time set by time constant ($\tau$) and/or defined by the small resistor 108.

Thus, the dynamic storage loop 112 is in a storing state if the product of inductance and the effective critical current is equal to or greater than one magnetic flux quantum ($\Phi_0$) and/or non-storing if the product is half of one magnetic flux quantum (i.e., $\Phi_0/2$) or less. Advantageously, the operation of the dynamic storage loop 112 minimizes loop recovery time (i.e., a time when the DSFQ circuitry is returning to its ground state for the next clock cycle and therefore is temporarily inoperable).

Figure 2:
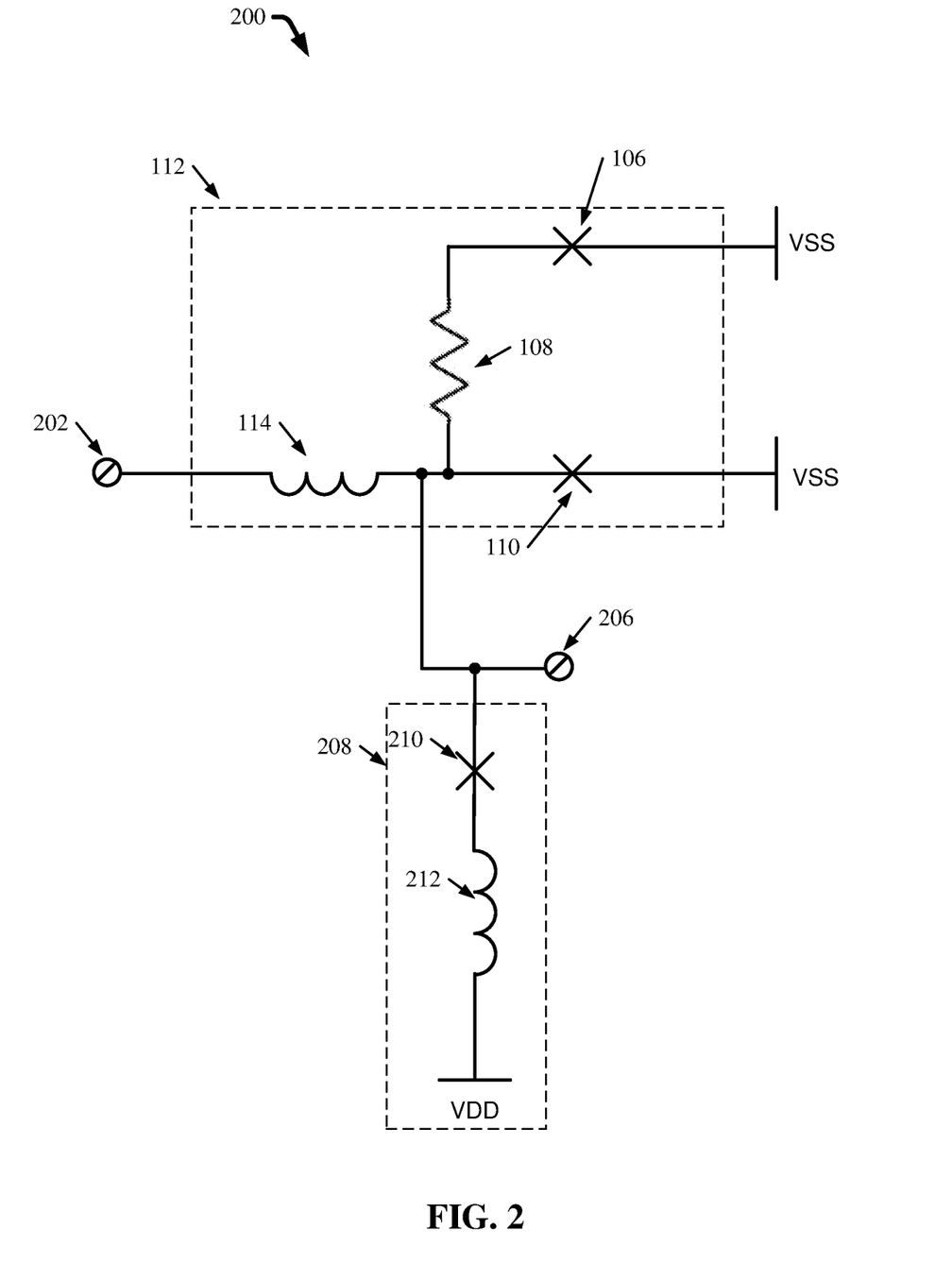
FIG. 2 illustrates a diagram of an example DSFQ delay buffer comprising a nonlinear magnetic flux leakage element in accordance with one or more embodiments described herein.

FIG. 2 illustrates an example DSFQ delay buffer 200 that comprises a one or more dynamic storage loops 112 in accordance with one or more embodiments described herein. Repetitive description of like elements employed in other embodiments described herein is omitted for sake of brevity. As shown in FIG. 2, the DSFQ delay buffer 200 comprises a dynamic storage loop 112 positioned between an input port 202 and a ground port (e.g., represented by "VSS" in FIG. 2). Further, the DSFQ delay buffer 200 comprises an output port 206 arranged between the nonlinear magnetic flux element 100 and the superconducting inductor 114 of the dynamic storage loop 112. Additionally, the output port 206 is electrically biased. For example, the output port 206 can be biased by a ERSFQ bias source 208, which comprises a limiter Josephson junction 210 (e.g., represented by an "X" in FIG. 2) connected in series with large inductor 212 (e.g., an inductor having a $\beta_L$ parameter of at least 100).

Figure 3:
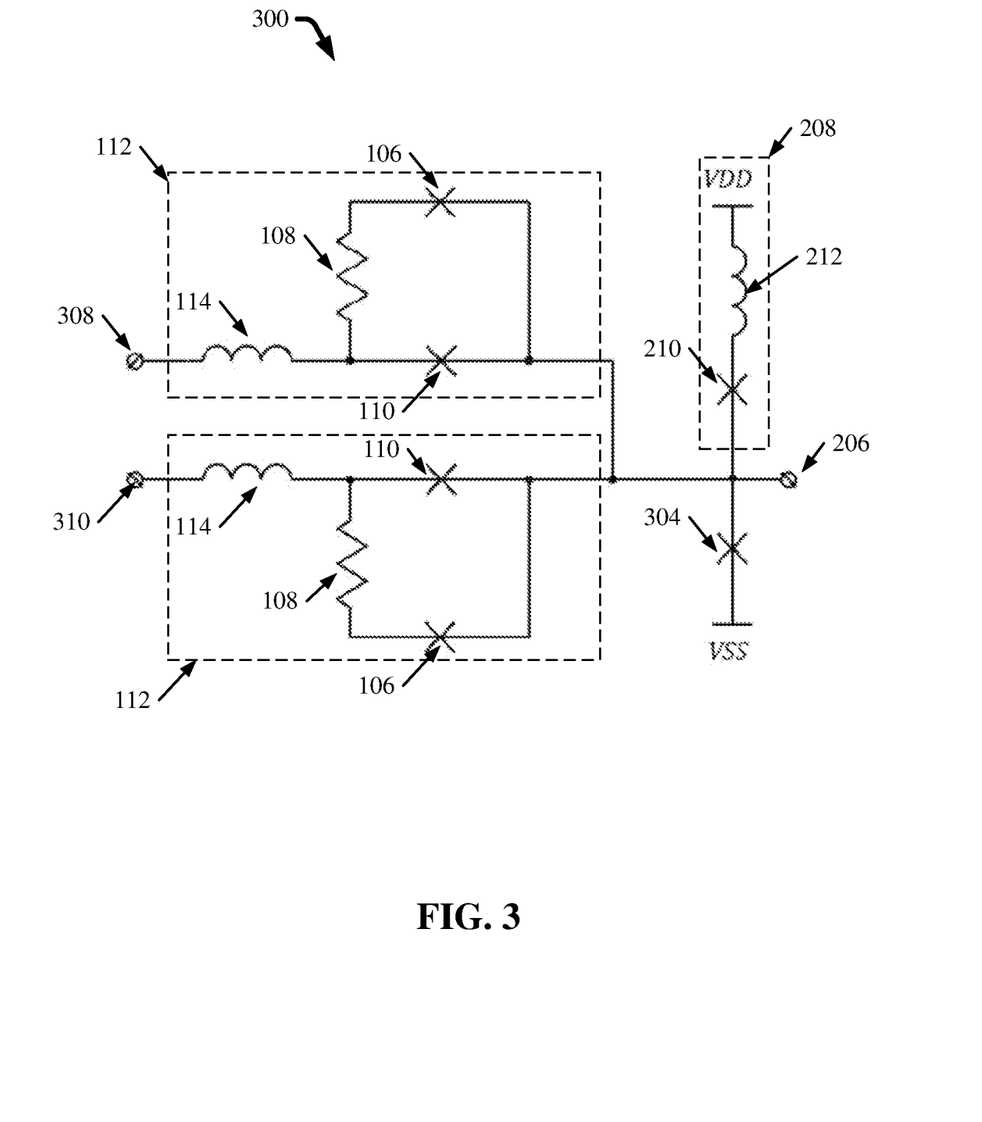
FIG. 3 illustrates a diagram of an example DSFQ AND logic gate comprising one or more nonlinear magnetic flux leakage elements in accordance with one or more embodiments described herein.

FIG. 3 illustrates an example DSFQ AND logic gate 300 that comprise a plurality of dynamic storage loops 112 in accordance with one or more embodiments described herein. Repetitive description of like elements employed in other embodiments described herein is omitted for sake of brevity. For example, FIG. 3 depicts a DSFQ AND logic gate 300 comprising two symmetric dynamic storage loops 112. However, one or more embodiments of the DSFQ AND logic gate 300 comprising three or more dynamic storage loops 112 are also envisaged. As shown in FIG. 3, "VDD" represents a high voltage electrical supply and/or "VSS" represents a ground (i.e., zero-voltage) electrical supply.

FIG. 3 depicts an exemplary 2-input DSFQ AND logic gate 300 that comprising: two first Josephson junctions 106, two second Josephson junctions 110, an ERSFQ bias source 208, and/or an output Josephson junction 304 (e.g., represented by an "X" in FIG. 3). As described herein, the two second Josephson junctions 110 are each be connected in parallel with their respective dynamic circuit branches (e.g., each dynamic circuit branch being a first circuit branch 102 comprising first Josephson junction 106 in series with a small resistor 108) to form two nonlinear magnetic flux leakage elements 100 within the respective dynamic storage loops 112. Output Josephson junction 304 drives the output port 206. A first nonlinear magnetic flux leakage element 100 is connected on one side to a first input port 308 through a superconducting inductor 114 while on the other side connected to the output Josephson junction 304, which can be biased by the ERSFQ bias source 208. Likewise, a second nonlinear magnetic flux leakage element 100 is connected on one side to a second input port 310 through a superconducting inductor 114 while on the other side connected to the output Josephson junction 304. In various embodiments, the first input port 308 and the second input port 310 are both be data input ports. The first input port 308 and the second input port 310 can be freely interchangeable without change to the function and/or operation of the DSFQ AND logic gate 300.

As used herein, the term "early pulse" refers to a SFQ pulse that arrives to an input port of a DSFQ logic circuit (e.g., a DSFQ AND logic gate 300) prior to other SFQ pulses in a respective cycle of operation. As used herein, the term "late pulse" refers to one or more second SFQ pulses that arrive to an input port of a DSFQ logic circuit subsequent to an early pulse in the respective cycle of operation.

The DSFQ AND logic gate 300 can operate in the following manner. When an early pulse arrives at the first input port 308 or the second input port 310, the SFQ pulse is stored dynamically within its respective dynamic storage loop 112 for a time defined by the time constant ($\tau$). If the late pulse does not arrive, both Josephson junctions in the dynamic storage loop 112 (e.g., the first Josephson junction 106 and/or the second Josephson junction 110) experience delayed switching and release the stored fluxon, thus resetting the DSFQ AND logic gate 300 to its ground state. Alternatively, if the late pulse does arrive early enough, that pulse first gets briefly stored in the second dynamic storage loop 112 (e.g., connected to the second input port 310), and then the sum of the currents in the two dynamic storage loops 112 quickly switches the output Josephson junction 304, accomplishing the desired AND logic function. As a consequence, all flux in the dynamic storage loops 112 would exit (i.e., as an SFQ pulse) through the output port 206, bringing the DSFQ AND logic gate 300 to its ground state.

Figure 4:
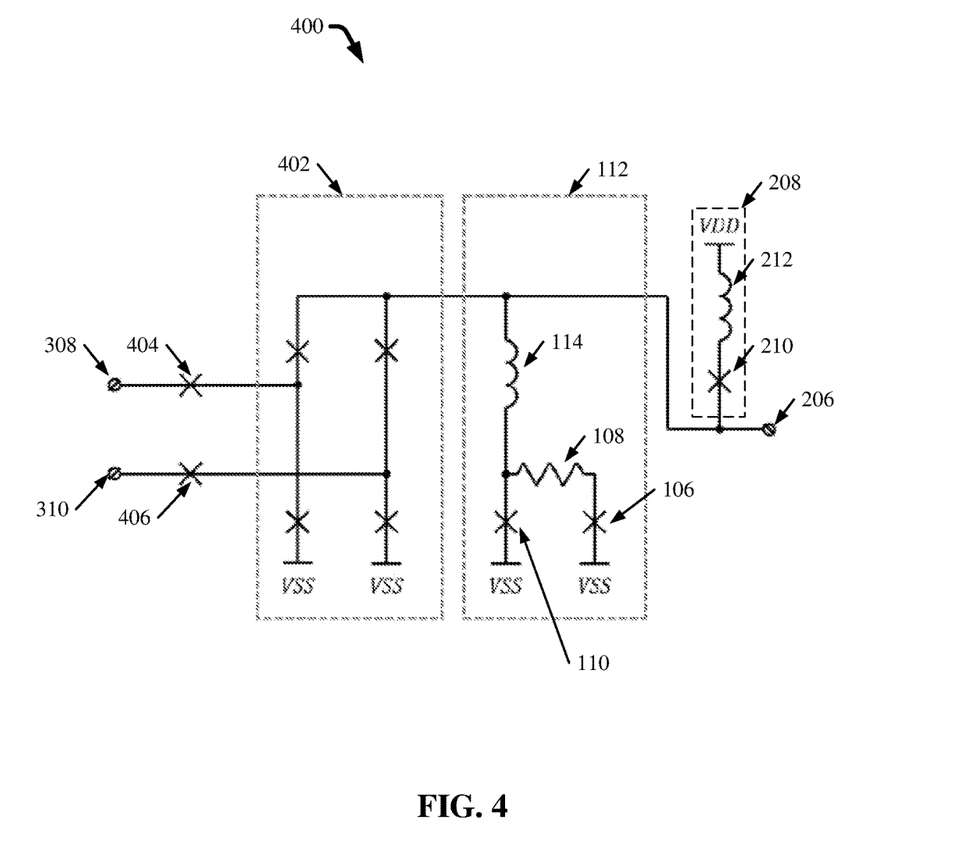
FIG. 4 illustrates a diagram of an example DSFQ OR logic gate comprising one or more nonlinear magnetic flux leakage elements in accordance with one or more embodiments described herein.

FIG. 4 illustrates an example DSFQ OR logic gate 400 comprising a one or more dynamic storage loops 112 in accordance with one or more embodiments described herein. Repetitive description of like elements employed in other embodiments described herein is omitted for sake of brevity.

FIG. 4 depicts an exemplary 2-input DSFQ OR logic gate 400 that comprising a confluence buffer 402 and/or a dynamic storage loop 112, which acts as dynamic power-down circuitry. As shown in FIG. 4, the confluence buffer 402 comprises four Josephson junctions (e.g., each represented by an "X" in FIG. 4). Further the confluence buffer 402 is connected to the first input port 308 through a first additional Josephson junction 404, and/or connected to the second input port 310 through a second additional Josephson junction 406. In various embodiments, the first input port 308 and/or the second input port 310 are symmetrical data input ports. Further, an output port of confluence buffer 402 can be biased by the ERSFQ bias source 208.

Comprised within the DSFQ OR logic gate 400, the dynamic storage loop 112 serves to dynamically power off the DSFQ OR logic gate 400 for a certain amount of time, to ensure that only one output SFQ pulse is generated in response to a skewed pair of input SFQ pulses. For example, the early pulse is processed by the DSFQ OR logic gate 400 like in a traditional confluence buffer (i.e., the confluence buffer 402 produces an output SFQ pulse with a small delay), then the bias current of the DSFQ OR logic gate 400 becomes diverted into the dynamic storage loop 112. Thereby, the late pulse encounters a powered down cell and becomes ejected by the first additional Josephson junction 404 and/or the second additional Josephson junction 406 on its respective input port (e.g., first input port 308 and/or second input port 310). Later the dynamic storage loop 112 self-resets (e.g., after a delay of about 30 ps) and/or restores the dc bias of the DSFQ OR logic gate 400 for the next cycle.

Advantageously, various embodiments of the DSFQ OR logic gate 400 described herein can be implemented with a RSFQ type dc power delivery mechanism and/or a ERSFQ type dc power delivery mechanism (e.g., as shown in FIG. 4). Traditional confluence buffer circuitries do not directly support ERSFQ type dc power delivery mechanisms since such mechanisms do not allow for circuits that produce more than one pulse per clock cycle (e.g., traditional confluence buffers can produce at least two). However, the additional Josephson junctions (e.g., the first additional Josephson junction 404 and/or the second additional Josephson junction 406) positioned between the two input ports of the confluence buffer 402 and the input ports of the overall DSFQ OR logic gate 400 (e.g., first input port 308 and/or second input port 310) along with the positioning of the dynamic storage loop 112 facilitate the incorporation of ERSFQ type dc power delivery mechanisms. For example, the additional Josephson junctions (e.g., the first additional Josephson junction 404 and/or the second additional Josephson junction 406) prevent the output port 206 from double-pulsing. Additionally, in one or more embodiments of the DSFQ OR logic gate 400, RSFQ type dc power delivery can be facilitated by an architecture (not shown) wherein the two additional Josephson junctions are removed, and/or another Josephson junction positioned between the output port of the confluence buffer and the input port of the dynamic storage loop 112. Thereby, dc power is applied to the confluence buffer 402 and thereby generates double-pulsing, but the output of the overall DSFQ OR logic gate 400 is taken from the input of the dynamic storage loop 112, which generates a single SFQ pulse.

Figure 5:
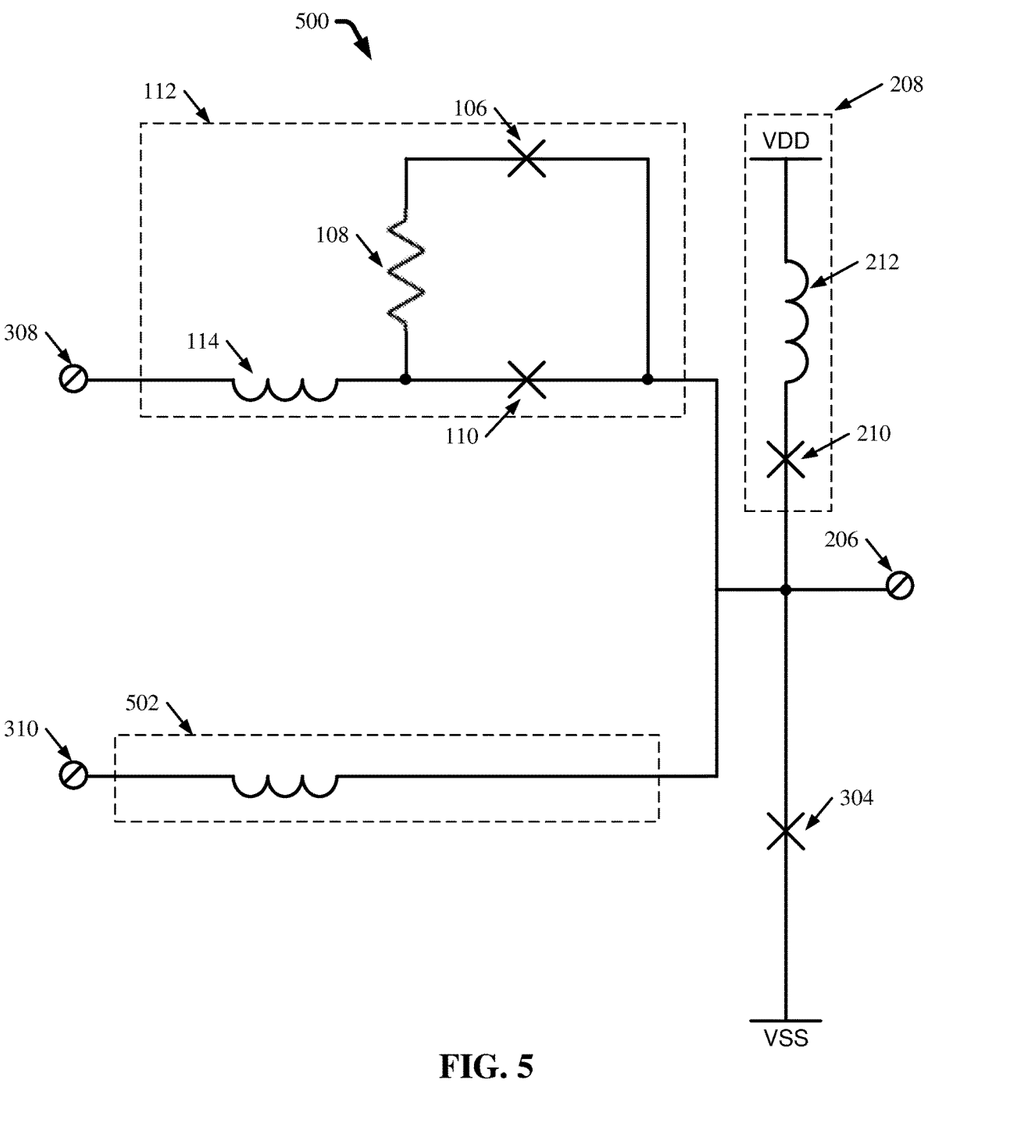
FIG. 5 illustrates a diagram of an example DSFQ transparent latch comprising a nonlinear magnetic flux leakage element in accordance with one or more embodiments described herein.

FIG. 5 illustrates an example DSFQ transparent latch 500 comprising one or more dynamic storage loops 112 in accordance with one or more embodiments described herein. Repetitive description of like elements employed in other embodiments described herein is omitted for sake of brevity. As shown in FIG. 5, the architecture of the DSFQ transparent latch 500 can be similar to the DSFQ AND logic gate 300, wherein a dynamic storage loop 112 is replaced with a static storage loop 502. For example, the static storage loop 502 comprises an inductor without a nonlinear magnetic flux leakage element 100, and thereby can exhibit an infinite hold time. Further, in comparison with the symmetric DSFQ AND logic gate 300, the input ports (e.g., first input port 308 and/or second input port 310) of the DSFQ transparent latch 500 are asymmetric, and while the second input port 310 is driven by an arbitrary data pattern, the first input port 308 is driven by a clock pattern that contains a pulse in each clock cycle.

The DSFQ transparent latch 500 can operate in the following manner. Wherein the early pulse is a data signal that arrive at the second input port 310, it is stored in static storage loop 502 until a clock signal arrives at the first input port 308 and reads the early pulse out of the static storage loop 502. Thus, for early data pulses the DSFQ transparent latch 500 acts as an opaque latch or a flip-flop latch. In contrast, wherein the data signal arrives after the clock signal, the data signal propagates through the DSFQ transparent latch 500 during a transparency window, which starts after the arrival of the clock signal and last for the duration of the dynamic hold time of the dynamic storage loop 112. Advantageously, the DSFQ transparent latch 500 can be useful for skew management in deep combinational logic networks, since the DSFQ transparent latch 500 allows for significant delay of early data signals (i.e., by letting the early data signals be stored during an opaque latch state until read out by the clock), yet introduces minimal delay to late data signals (i.e., data signals that encounter the DSFQ transparent latch 500 after it has changed to a transparent state); thereby reducing the spread of data pattern delays and/or reducing overall data skew.

Figure 6:
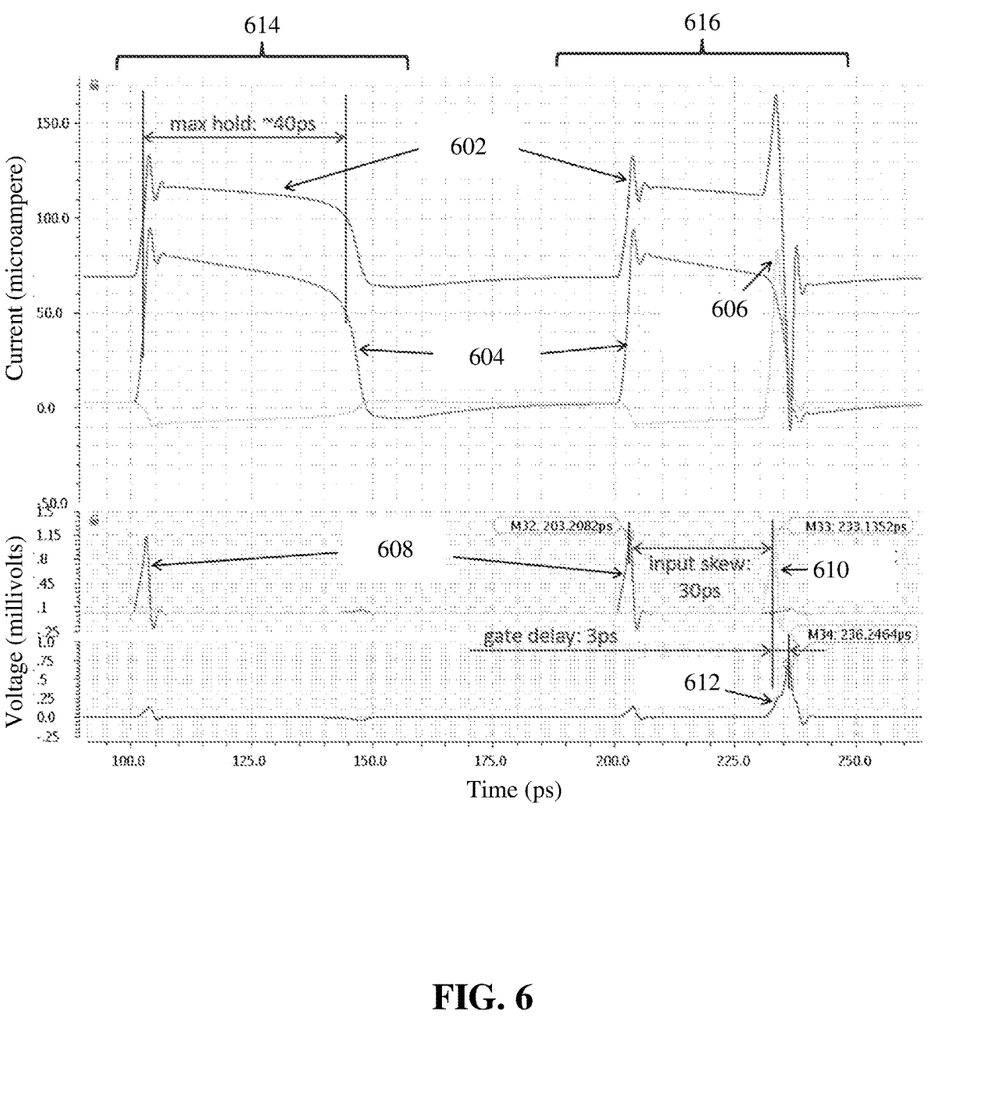
FIG. 6 illustrates a diagram of an example graph that can depict results of a transient simulation of a DSFQ AND logic gate comprising two symmetric nonlinear magnetic flux leakage elements in accordance with one or more embodiments described herein.

FIG. 6 illustrates a diagram of an example graph 600 that depicts one or more results of a transient simulation of the DSFQ AND logic gate 300 in accordance with one or more embodiments described herein. Repetitive description of like elements employed in other embodiments described herein is omitted for sake of brevity.

The plotted waveforms depicted in graph 600 regard currents in the superconducting inductors 114 and/or the output Josephson junction 304; plus, voltages on the first input port 308, the second input port 310, and/or the output port 206. For example, the first line 602 represents current in the output Josephson junction 304, the second line 604 represents current in the superconducting inductor 114 receiving the early pulse, the third line 606 represents current in the superconducting inductor 114 receiving the late pulse, the fourth line 608 represents voltage on the first input port 308 (i.e., driven by the early pulse), the fifth line 610 represents voltage on the second input port 310 (i.e., driven by the late pulse), and/or the sixth line 612 represents voltage on the output port 206. As shown in FIG. 6, deviation between the fourth line 608 and the fifth line 610 defines the input skew (e.g., about 30 ps) of the DSFQ AND logic gate 300.

Graph 600 depicts the signals plotted for two cycles of cell operation at 10 GHz. The first cycle 614 regards a cycle of cell operation in which the late pulse never arrives (i.e., thereby causing first dynamic storage loop 112 to self-reset after ~40 ps of dynamic hold time), and/or the second cycle 616 regards a cycle of cell operation in which the late pulse arrives 30 ps after the early pulse (e.g., with the inputs having a 30 ps skew). The second cycle 616 produces the expected output pulse with a gate delay of ~3 ps. Graph 600 demonstrates that the gate input skew tolerance can exceed ten times the gate delay for one or more of the embodiments described herein.

Figure 7:
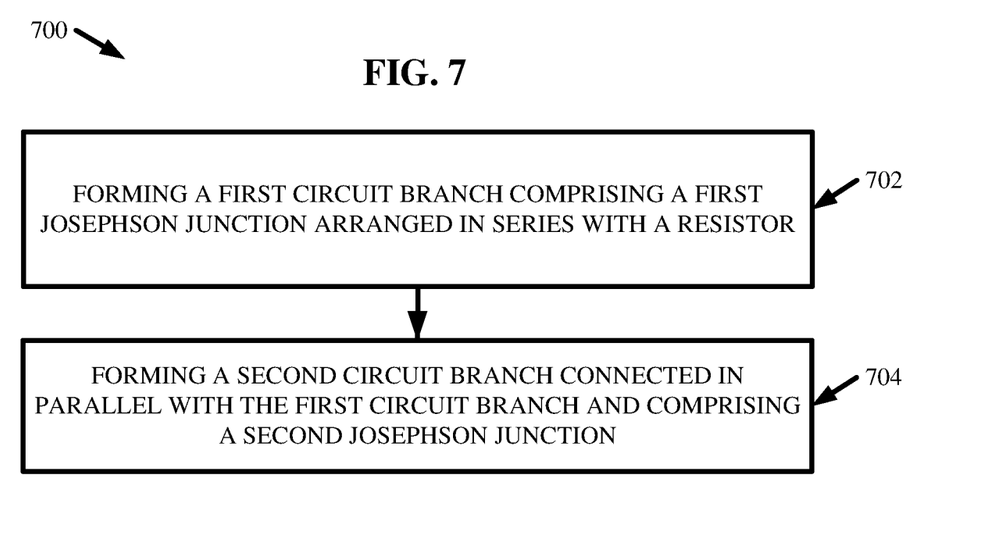
FIG. 7 illustrates a flow diagram of an example method that can facilitate manufacturing of one or more DSFQ logic circuits in accordance with one or more embodiments described herein.

FIG. 7 illustrates a flow diagram of an example method 700 that can facilitate manufacturing of one or more DSFQ logic circuits in accordance with one or more embodiments described herein. Repetitive description of like elements employed in other embodiments described herein is omitted for sake of brevity.

At 702, the method 700 comprises forming a first circuit branch 102 comprising a first Josephson junction 106 arranged in series with a small resistor 108. In one or more embodiments the small resistor 108 has a small amount of electrical resistance (e.g., greater than or equal to 0.10 Ω and less than or equal to 10 Ω).

At 704, the method 700 comprises forming a second circuit branch 104 in parallel with the first circuit branch 102 and/or comprising a second Josephson junction 110. In one or more embodiments, the forming at 702 and/or 704 creates a nonlinear magnetic flux leakage element 100. Additionally, the method 700 comprises connecting the nonlinear magnetic flux leakage element 100 and a superconducting inductor 114 in series to form a dynamic storage loop 112. The dynamic storage loop 112 can be incorporated into one or more dc-powered DSFQ logic circuits (e.g., DSFQ delay buffer 200, DSFQ AND logic gate 300, DSFQ OR logic gate 400, DSFQ transparent latch 500), wherein the dynamic storage loop 112 enables the DSFQ logic circuits to have a self-resetting internal state characterized by two time constants. For example, a first time constant of the self-resetting internal state is defined by the small resistor 108 comprised within the nonlinear magnetic flux leakage element 100. Also, a second time constant of the self-resetting internal state is an intrinsic time constant of Josephson junctions. For instance, the self-resetting internal state is at least partially characterized by Equations 1-3 described herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
a first circuit branch comprising a first Josephson junction arranged in series with a resistor;
a second circuit branch connected in parallel with the first circuit branch and comprising a second Josephson junction, wherein the first circuit branch is a dynamic circuit branch and wherein the second circuit branch is a static circuit branch;
a superconducting inductor connected in series with a parallel connection of the first circuit branch and the second circuit branch; and
an output port electrically biased by an energy-efficient rapid single flux quantum bias source comprised of a limiter Josephson Junction connected in series with a second inductor.

2. The apparatus of claim 1, wherein the superconducting inductor connected in series with the parallel connection of the first circuit branch and the second circuit branch establishes a dynamic self-resetting internal state characterized by a first time constant and a second time constant.

3. The apparatus of claim 2, wherein the first time constant is an intrinsic constant to Josephson junctions.

4. The apparatus of claim 2, wherein the second time constant is defined by the resistor.

5. A method, comprising:
forming a first circuit branch comprising a first Josephson junction arranged in series with a resistor; and forming a second circuit branch coupled with the first circuit branch and comprising a second Josephson junction, wherein the first circuit branch is a dynamic circuit branch and wherein the second circuit branch is a static circuit branch.

6. The method of claim 5, further comprising:
connecting a superconducting inductor in series with a parallel connection of the first circuit branch and the second circuit branch.

7. The method of claim 6, wherein a first critical current of the first Josephson junction is a first value and a second critical current of the second Josephson junction is a second value, and wherein the first value is less than the second value.

8. The method of claim 5, wherein the superconducting inductor connected in series with the parallel connection of the first circuit branch and the second circuit branch establishes a dynamic self-resetting internal state characterized by a first time constant and a second time constant.

9. The method of claim 8, wherein the first time constant is an intrinsic time constant to Josephson junctions.

10. The method of claim 8, wherein the second time constant is defined by the resistor.

11. An apparatus, comprising:
a first circuit branch comprising a first Josephson junction arranged in series with a resistor; and
a second circuit branch coupled with the first circuit branch and comprising a second Josephson junction, wherein the first circuit branch is a dynamic circuit branch and wherein the second circuit branch is a static circuit branch.

12. The apparatus of claim 11, further comprising a superconducting inductor connected in series with a parallel connection of the first circuit branch and the second circuit branch.

13. The apparatus of claim 12, wherein the superconducting inductor connected in series with the parallel connection of the first circuit branch and the second circuit branch establishes a dynamic self-resetting internal state.

14. The apparatus of claim 13, wherein the dynamic self-resetting internal state is characterized by a first time constant and a second time constant.

15. The apparatus of claim 13, wherein the first time constant is an intrinsic constant to Josephson junctions.

16. The apparatus of claim 13, wherein the second time constant is defined by the resistor.

17. The apparatus of claim 11, wherein a first critical current of the first Josephson junction is a first value and a second critical current of the second Josephson junction is a second value, and wherein the first value is less than the second value.

18. The apparatus of claim 11, wherein a first critical current of the first Josephson junction is a first value and a second critical current of the second Josephson junction is a second value, and wherein the first value is equal to the second value.

19. The apparatus of claim 11, wherein the resistor is an external shunt resistor adapted to damp the plasma resonance of the first Josephson junction and the second Josephson junction.

\* \* \* \* \*